(12) United States Patent
Kutz et al.

(10) Patent No.: US 7,415,263 B2
(45) Date of Patent: Aug. 19, 2008

(54) RECEIVER FOR A WIRELESS COMMUNICATION DEVICE

(75) Inventors: Gideon Kutz, Herzelia (IL); Amir I. Chass, Herzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 344 days.

(21) Appl. No.: 11/003,188

(22) Filed: Dec. 3, 2004

(65) Prior Publication Data
US 2005/0172201 A1 Aug. 4, 2005

(30) Foreign Application Priority Data
Dec. 5, 2003 (GB) .................................. 0328307.4

(51) Int. Cl.
*H04B 1/16* (2006.01)
(52) U.S. Cl. .................. 455/334; 455/63.1; 455/67.13; 714/790; 375/137; 375/341
(58) Field of Classification Search ................ 455/130, 455/63.1, 67.13, 334; 375/316, 341, 137; 714/748, 790, 791, 794, 795
See application file for complete search history.

(56) References Cited

U.S. PATENT DOCUMENTS

| 7,000,173 | B2 * | 2/2006 | Buckley et al. | 714/790 |
| 2003/0074476 | A1 * | 4/2003 | Kim et al. | 709/246 |
| 2003/0138059 | A1 * | 7/2003 | Xu et al. | 375/316 |
| 2003/0185159 | A1 * | 10/2003 | Seo et al. | 370/278 |

OTHER PUBLICATIONS

Bickerstaff et al; "A Unified Turbo/Viterbi Channel Decoder for 3GPP Mobile Wireless in 0.18-um CMOS" IEEE Journal of Solid-State Circuits, vol. 37, No. 11, Nov. 2002, pp. 1555-1564.

* cited by examiner

*Primary Examiner*—Edward Urban
*Assistant Examiner*—Raymond S. Dean

(57) ABSTRACT

A receiver for a wireless communication device comprising means for determining a sequence of code block addresses for received rate matched encoded data to allow rate de-matching and decoding to be performed on a code block by code block basis for the received rate matched encoded data.

14 Claims, 1 Drawing Sheet

RECEIVER FOR A WIRELESS COMMUNICATION DEVICE

The present invention relates to a receiver for a wireless communication device.

Wireless communication systems are widely deployed to provide various types of communications such as voice and data. One such system is wideband code division multiple access WCDMA, which has been adopted in various competing wireless communication standards, for example $3^{rd}$ generation partnership project 3GPP and 3GPP2.

The main physical data channel defined in the 3GPP standard is the high speed downlink shared channel HS-DSCH, which is used to provide high data rates in the downlink direction. The basic transmission unit that is defined for the HSDSCH is the time transmission interval TTI that corresponds to a radio sub-frame of 3 slots.

As defined in the 3GPP TS 25.212 standard the coding for the HS-DSCH channel is performed on a transport block once every TTI (i.e. coding is performed on a block of data that corresponds to the data received during a TTI).

The coding involves segmenting a transport block into code blocks for encoding by a turbo encoder and concatenating the encoded data blocks back into transport blocks before passing the transport blocks to a hybrid-automatic repeat request module H-ARQ.

As shown in FIG. 1, the H-ARQ 100 consists of a first stage rate matching module 101, a second stage rate matching module 102 and a virtual buffer 103, with the H-ARQ 100 receiving data from a turbo encoder (not shown).

During operation data, with CRC bits attached, is input into the turbo encoder, which would typically have a coding rate of ⅓. As the turbo encoder encodes data on a code block by code block basis, where a code block is smaller than a transport block, the transport block is segmented into code block prior to being input into the turbo encoder. The turbo encoder outputs systematic bits, the same data sequence provided to the encoder, and parity 1 bits and parity 2 bits, where the parity 1 and parity 2 bits represent redundancy bits. The systematic bits, the parity 1 bits and the parity 2 bits are provided to the H-ARQ 100 where the first stage rate matching module 101 performs rate matching on the parity 1 bits and parity 2 bits.

The purpose of the first stage rate matching module 101 is to reduce the size of the encoded transport block, by puncturing the code as defined in TS 25.212, to a size that will allow the punctured code (i.e. rate matched) to fit into a specified buffer on a wireless communication receiver.

For example, if the size of the data packet input to the turbo encoder, which corresponds to a transport block, is 100 bits, the output from the turbo encoder will be 300 bits (i.e. 100 systematic bits, 100 parity 1 bits and 100 parity 2 bits). If the receiving equipment has only a 240 bit buffer in the receiving chain, the first stage rate matching module 101 is arranged to reduce the number of bits from 300 to 240 by puncturing 60 bits from the parity 1 bits and parity 2 bits.

To enable the correct puncturing of bits rate-matching parameters (i.e. $m_i$ the number of bits in a block, $e_{ini}$ the rate matching parameter for the initial error e for determining the phase of the bit puncturing, $e_{minus}$ the rate matching parameter that is a decrement of e, and $e_{plus}$ is the rate matching parameter that is an increment of e) are computed based on the number of bits to be punctured for a TTI, as defined in TS 25.212.

Once the rate matching parameters are computed the rate matching pattern (i.e. the puncturing scheme) can be determined in accordance with the defined algorithm within TS 25.212, which is as follows:

$e = e_{ini}$—set initial value for error e
X=1—set initial value for bit index X
do while (X≦$m_i$)—perform loop $m_i$ times for $m_i$ input bits
   $e = e - e_{ini}$—update error e
   if (e≦0) then—check if bit $m_x$ should be punctured
     set bit $m_x$ to δ—puncture bit $m_x$ by setting it to δ
     $e = e + e_{plus}$—update error e after a puncture
   end if
   X=X+1—update bit index X for the next bit
end do By way of further illustration, if 18 bits need to be reduced to 16 bits the rate matching parameters would be initially computed as: $m_i$=18, $e_{ini}$=1, $e_{plus}$=36 and $e_{minus}$=4. Consequently, implementing the above algorithm using these rate matching parameters results in bits 1 and 10 being punctured.

The virtual buffer 103 stores the rate matched code prior to being further rate matched by the second stage rate matching module 102 to rate match the data stored in the virtual buffer 103 to the actual physical channel size.

On receipt by the receiving equipment the received rate matched encoded data is initially rate de-matched to remove the effects of the second stage rate matching process and stored in the specified buffer, corresponding in size to the virtual buffer. The receiver then performs rate de-matching on the stored encoded data to replace the bits removed during the first stage rate matching process with zero values. The rate de-matched encoded data, which will be the same size as the encoded transport block (i.e. approximately three times the size of the original transport block), is then stored in memory.

The rate de-matched encoded data is then segmented before being passed to a turbo decoder to decode the encoded data.

However, this process requires the use of a large memory to store the rate de-matched encoded data prior to decoding.

EP0797307 and EP1261161 describe very simple rate dematching mechanisms. However, neither mechanisms described are suitable for third generation cellular standards.

WO 02/037698—describes an arrangement that integrates interleaving and rate dematching functions.

It is desirable to improve this situation.

In accordance with a first aspect of the present invention there is provided a receiver for a wireless communication device according to claim 1.

This provides the advantage of allowing a receiver for a wireless communication device to have less memory and to save power consumption by requiring less memory accesses as well as reducing processor MIPS.

In accordance with a second aspect of the present invention there is provided a method for decoding encoded data in a wireless communication system according to claim 10.

An embodiment of the invention will now be described, by way of example, with reference to the drawings, of which:

A primary distinguishing feature of the present invention is the ability to perform combined rate dematching and decoding independently on each code block. This is facilitated by a segmentation module which, using direct calculations, determines the address of the first data in each code block independently and also the address of the end (last data) of each code block independently. In contrast, WO 02/037698 performs the rate dematching and decoding sequentially block after block and is restricted to this processing.

The ability to identify the starting address and end address of each code block is important for efficient decoding. This is because, for example:

in 3GPP standard, each code block is followed by a number of tail bits. These tail bits are used for doing some pre calculations and the result of these pre calculations is transferred to the Turbo decoder prior to the start of the block decoding. It is therefore useful to be able to determine the end address of some specific code block (which is the start address of its associated tail bits) in order to do that calculations before the block is rate dematched and decoded. This is facilitated by the segmentation module that calculates this address.

The determination of code block boundaries enables ordering of data in memory in an efficient manner so that each starting address of each code block is 8 bytes aligned (that is, the address is an integer multiple of 8). This allows for more efficient memory accesses by the Turbo decoder.

Figure 1:
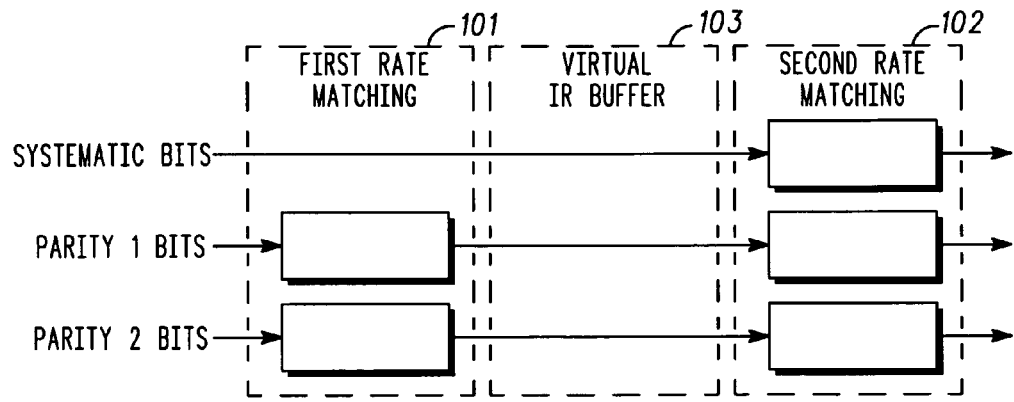
FIG. 1 illustrates a prior art hybrid-automatic repeat request module.
Figure 2:
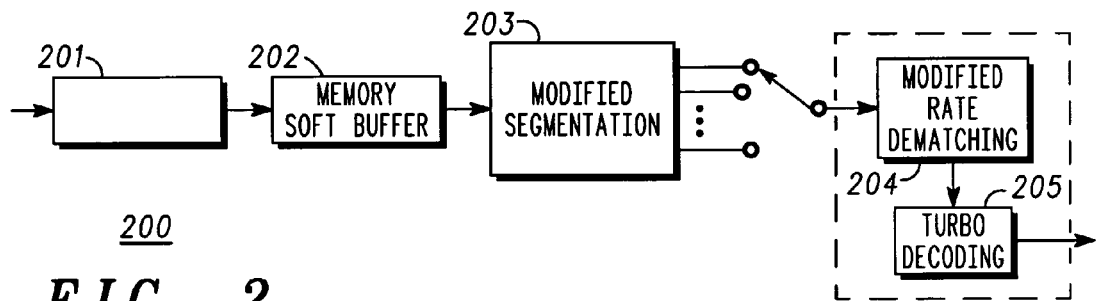
FIG. 2 illustrates a receiver according to an embodiment of the present invention.

FIG. 2 illustrates a decoding stage 200 of a wireless receiver, for use in a 3GPP W-CDMA radiotelephone.

The decoding stage 200 includes a second stage rate de-matching module 201, a buffer 202, a segmentation module 203, a first stage rate de-matching module 204 and a turbo decoder 205.

The decoding stage 200 receives rate matched encoded data transmitted by a 3GPP compliant transmitter and inputs the data to the second stage rate de-matching module 201. The second stage rate de-matching module 201 reverses the effects of the second stage rate matching performed by the H-ARQ 100 within the transmitter to generate data that represents the first stage rate matched encoded data generated by the first stage rate matching module 101 within the H-ARQ 100.

The replicated first stage rate matched encoded data is input into the buffer 202, which is typically a ratio of the size of the virtual buffer 103 in the transmitter H-ARQ 100. For example, if each bit in the transmitter corresponds to a byte being received by the receiver the buffer 202 will be eight times the virtual buffer 103.

As the rate matching process involves the puncturing of data the size of a rate matched encoded data block will be smaller than the corresponding rate de-matched encoded block (i.e. the original pre rate matched data). Consequently, the code block boundaries for the rate matched encoded data stored in the buffer 202 will no longer correspond to the original code block boundaries of the encoded data prior to rate matching performed by the first stage rate matching module 101. Accordingly, if the rate de-matching module 204 extracted the rate matched encoded data from the buffer 202 using the original code block base addresses and provided the corresponding rate de-matched encoded data to the turbo decoder 205 on a block by block basis incorrect results would be obtained.

To allow the first rate de-matching module 204 to extract the rate matched encoded data from the buffer 202 such that the first rate de-matching module 204 is able to rate de-match the encoded data and provide the data to the turbo decoder 205 on a block by block basis (i.e. on the fly) the segmentation module 203 is arranged to determine the locations in the rate matched encoded data stored in the buffer 202 that correspond to the original base addresses for the pre rate matched encoded data (i.e. the rate matched block base addresses).

Accordingly, using the rate matched block base addresses the first stage rate de-matching module 204 extracts the rate matched encoded data and performs rate de-matching on segments of data that correspond to the original code blocks, thereby allowing the turbo decoder 205 to decode the encoded code blocks on the fly from data received from the first stage rate de-match module 204 and thus avoiding the need to store rate de-matched data prior to decoding by the decoder 205.

The rate de-matching algorithm used by the first rate de-matching module 204 to recover the punctured data (i.e. data replication) is:

$e=e_{ini}$—set initial value for error e $X=1$—set initial value for bit index X do while ($X \leq m_i$)—perform loop $m_i$ times for $m_i$ input bits $\quad e=e-e_{minus}$—update error e $\quad$ if ($e \leq 0$) then—check if bit X should be repeated $\quad\quad$ repeat bit $m_x$—repeat bit $m_x$ $\quad\quad e=e+e_{plus}$—update error e after a repetition $\quad$ end if $\quad X=X+1$—update bit index X for the next bit end do The basis for the derivation of the rate matched base addresses generated by the segmentation module 203 is as follows:

From the rate de-matching algorithm described above, and as specified in TS 25.212, it can be concluded that the value of e after i iterations of the algorithm can be defined as $$e = e_{init} - ie_{minus} + N_{punc}e_{plus} \quad\quad 1.1)$$

where $N_{punc}$ is the number of inserted zero values in the rate de-matching process after i iterations.

As $e_{init} \leq e_{plus}$ then e must be greater than 0 and e must be smaller or equal to $e_{plus}$ after a complete iteration of the rate matching algorithm.

Accordingly equation 1.1 can be written $$0 < e_{init} - ie_{minus} + N_{punc}e_{plus} \leq e_{plus} \quad\quad 1.2)$$

Therefore, $$\frac{-e_{init} + ie_{minus}}{e_{plus}} < N_{punc} \leq \frac{-e_{init} + ie_{minus}}{e_{plus}} + 1 \quad\quad 1.3)$$

Since $N_{punc}$ has to be an integer it follows that $$N_{punc} = \left\lfloor \left\lfloor \frac{ie_{minus} - e_{init}}{e_{plus}} + 1 \right\rfloor \right\rfloor$$

where $\lfloor x \rfloor$ is the floor of the function 'x'

As such, $N_{punc}$ represents the number of bits that will be inserted after i iterations of the algorithm.

Accordingly to find the equivalent base addresses of the original encoded code blocks (i.e. pre-rate matched data) within the rate matched encoded data stored in the buffer 202 i is replaced with the original encoded code block base addresses (i.e. 0, B, 2B, 3B etc) and $N_{punc}$ is subtracted from the original code block base address.

Consequently, the base address for the first code block will be zero. The base address for the second code block will be:

$$B - \left[\left[\frac{Be_{minus} - e_{init}}{e_{plus}} + 1\right]\right]$$

The base address for the third code block will be:

$$2B - \left[\left[\frac{2Be_{minus} - e_{init}}{e_{plus}} + 1\right]\right]$$

and so on.

The above calculations are performed independently for both parity 1 bits and parity 2 bits—which are both rate matched by the first rate matching module 101. As the systematic bits are not rate matched by the first rate matching module 101 the original code block base addresses can be used when reading the data out of the buffer 202.

To compensate for the change in the determination of code block boundary base addresses, the rate de-matching module 204 is arranged to calculate $e_{init}$ for each received block of rate matched encoded data where $e_{init}$ is set equal to the initial value of $e_{init}$ for the first block and for subsequent code blocks $$e_{init} = e_{init} - Be_{minus} + \left[\frac{Be_{minus} - e_{init}}{e_{plus}} + 1\right]e_{plus}$$

where B corresponds to the location that would equate to the start of a code block for a given rate de-matched block number.

Figure 3:
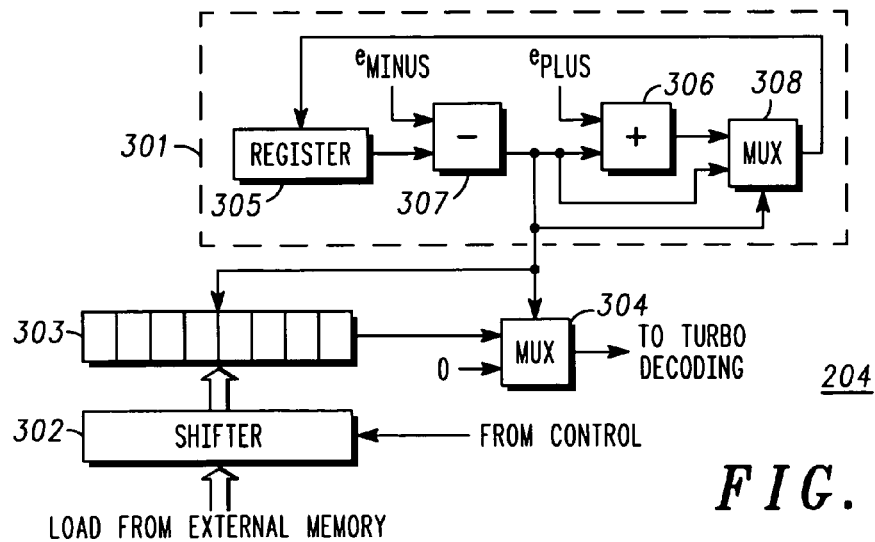
FIG. 3 illustrates a rate de-matching stage according to an embodiment of the present invention.

FIG. 3 illustrates the rate de-matching module 204. The rate de-matching module 204 includes a circuit 301 for implementing the de-puncturing algorithm specified above, a shifter 302, a data shift register 303 (e.g. a FIFO) and a first multiplexer 304.

The circuit 301 for implementing the de-puncturing algorithm includes a register 305, an adder 306, a subtractor 307, and a second multiplexer 308. The register 305 holds the value of e after each rate dematching cycle (i.e. iteration). The value of e stored in the register 305 is provided to the subtractor 307 where the value of $e_{minus}$ is subtracted from e. The result of the subtraction determines whether a current bit should be de-punctured (i.e. if a zero value should be inserted into the code block). If a zero should be inserted into the code block a control signal is sent from the subtractor 307 to the first multiplexer 304. In addition, the result of the subtraction is provided to the adder 306 where the value of $e_{plus}$ is added to the result, which is provided to the second multiplexer 308. If the value of $e-e_{minus}$ is positive the multiplexer 308 stores $e-e_{minus}$ in the register 305, if the values of $e-e_{minus}$ is negative the multiplexer 308 stores $e-e_{minus}+e_{plus}$ in the register 305.

Once the segmentation module 203 has calculated the code block boundaries, as described above, the data stored in the buffer 202 is loaded into the shifter 302, which is used to shift the input data to that the data is aligned with the end of the FIFO 303 (i.e. the data shift register) queue. The shifter 302 receives a control signal indicating the current length of the queue (i.e. the number of valid bits in the queue), thereby allowing the shifter 302 to place new received data at the end of the queue.

The data loaded into the shifter 302 is then loaded into the data shift register 303, which feeds the data to the first multiplexer 304. If no control signal is received from the subtractor 307 the first multiplexer 304 outputs a bit from the FIFO 303 to the decoder 205 for decoding, if a control signal is received from the subtractor 307 a zero is added to the data stream and output to the decoder 205.

It will be apparent to those skilled in the art that the disclosed subject matter may be modified in numerous ways and may assume many embodiments other than the preferred forms specifically set out as described above, for example the above embodiments could be arranged such that the rate de-matching module 204 could be arranged to determine the equivalent base addresses of the pre rate matched encoded code blocks within the rate matched encoded code blocks stored in the buffer 202, which the rate de-matching module 204 uses to allow the rate de-matching module 204 and turbo decode 205 to rate de-match and decode respectively on the fly on a code block by code block basis.

We claim:

1. A receiver for a wireless communication device comprising:
   a segmentation module for deriving a sequence of code block addresses of received rate matched encoded data;
   a rate de-matching module for rate de-matching the received rate matched encoded data on a code block by block basis using code block addresses derived by the segmentation module, thereby generating rate de-matched data on a block by block basis; and
   a decoder for decoding the rate de-matched data, wherein the rate de-matching and decoding are each performed independently on a code block by code block basis.

2. A receiver according to claim 1, further comprising:
   a buffer for storing received rate matched encoded data; wherein
   the rate de-matching module is arranged to rate de-match the rate matched encoded data on the fly from the buffer.

3. A receiver according to claim 1, further comprising a decoder for decoding the rate de-matched data generated by the rate de-matching module on a block by block basis.

4. A receiver according to claim 1, wherein the determination function is arranged to derive the sequence of code block addresses for the received rate matched encoded data using rate matching parameters used to rate match the received rate matched encoded data.

5. A receiver according to claim 1, wherein the segmentation module determines an address of first data in each code block independently.

6. A receiver according to claim 5, wherein the segmentation module determines an address of end data of each code block independently of determining the address of first data.

7. A receiver according to claim 1, wherein the segmentation module is arranged to derive the sequence of code block addresses using:

$$B - \left[\left[\frac{Be_{minus} - e_{init}}{e_{plus}} + 1\right]\right]$$

where B corresponds to a location that would equate to a start of a code block for a given rate de-matched block number;

einit is the a matching parameter for an initial value of e for determining a phase of bit puncturing;

eminus is a rate matching parameter that is a decrement of e;

eplus is a rate matching parameter that is an increment of e.

8. A receiver according to claim 7, wherein the rate de-matching module is arranged to calculate einit for each received block of rate matched encoded data.

9. A receiver according to claim 8, wherein the rate de-matching module is arranged to derive the einit value for block of received rate de-matched encoded data using:

einit=einit for a first block and $$e_{init} = e_{init} - Be_{minus} + \left[\frac{Be_{minus} - e_{init}}{e_{plus}} + 1\right]e_{plus}$$

for second and subsequent blocks, where B corresponds to a location that would equate to a start of a code block for a given rate de-matched block number.

10. A receiver according to claim 1, configured to support rate de-matching and decoding of 3GPP signals.

11. A method for decoding encoded data in a wireless communication system, the method comprising:
  receiving rate matched encoded data;
  deriving a sequence of code block addresses of a received rate matched encoded data;
  rate de-matching the received rate matched encoded data on a block by block basis using the sequence of code block addresses to determine block boundaries within the received rate matched encoded data; and
  decoding rate de-matched data on a block by block basis, wherein the steps of rate de-matching and decoding are each performed independently on a code block by code block basis.

12. A receiver for a wireless communication device comprising:
  a determination function for determining a sequence of code block addresses for received rate matched encoded data, the determination function being performed by a segmentation module;
  a combination of rate de-matching and decoding performed independently on a code block by code block basis for the received rate matched encoded data; wherein
  the segmentation module is arranged to derive the sequence of code block addresses using:

$$B - \left\lfloor\left[\frac{Be_{minus} - e_{init}}{e_{plus}} + 1\right]\right\rfloor$$

where B corresponds to a location that would equate to a start of a code block for a given rate de-matched block number;
einit is the a matching parameter for an initial value of e for determining a phase of bit puncturing;
eminus is a rate matching parameter that is a decrement of e;
eplus is a rate matching parameter that is an increment of e.

13. A receiver according to claim 12, wherein the rate de-matching module is arranged to calculate einit for each received block of rate matched encoded data.

14. A receiver according to claim 13, wherein the rate de-matching module is arranged to derive the einit value for block of received rate de-matched encoded data using:

einit=einit for a first block and $$e_{init} = e_{init} - Be_{minus} + \left[\frac{Be_{minus} - e_{init}}{e_{plus}} + 1\right]e_{plus}$$

for second and subsequent blocks, where B corresponds to a location that would equate to a start of a code block for a given rate de-matched block number.

* * * * *